United States Patent [19]

Ito

[11] Patent Number: 4,833,276
[45] Date of Patent: May 23, 1989

[54] SHIELD STRUCTURE OF ELECTRONIC EQUIPMENT

[75] Inventor: Takeo Ito, Souma, Japan

[73] Assignee: Alps Electric Co., Ltd., Japan

[21] Appl. No.: 88,693

[22] Filed: Aug. 21, 1987

[30] Foreign Application Priority Data

Nov. 17, 1986 [JP] Japan .......................... 61-176364[U]

[51] Int. Cl.$^4$ ............................................. H05K 9/00
[52] U.S. Cl. .................................. 174/35 R; 174/52.3; 220/359
[58] Field of Search .......................... 174/35 R, 52 S; 361/424; 331/67, 68; 455/300, 301; 220/359

[56] References Cited

U.S. PATENT DOCUMENTS 1,208,355 12/1916 Nechamkus ......................... 220/359
4,214,360 7/1980 Tuma et al. ............................ 29/829

FOREIGN PATENT DOCUMENTS 560977 4/1944 United Kingdom .............. 174/52 S

Primary Examiner—Arthur T. Grimley
Assistant Examiner—David A. Tone
Attorney, Agent, or Firm—Guy W. Shoup; Paul J. Winters; Brian D. Ogonowsky

[57] ABSTRACT

In a shield structure of an electronic equipment including a printed circuit board on which electronic parts are mounted, a box having an upper opening for receiving the printed circuit board, and a shielding planar cover for shieldably covering the upper opening of the box, the cover being soldered at its peripheral edge to a side wall of the box; the improvement is characterized in that the peripheral edge of the cover is arcuately downwardly bent.

3 Claims, 5 Drawing Sheets

SHIELD STRUCTURE OF ELECTRONIC EQUIPMENT

BACKGROUND OF THE INVENTION

The present invention relates to an improvement in shield structure of an electronic equipment, particularly of a synthesizer unit or a voltage control oscillator to be employed in a mobile telephone or the like.

Generally, in an electronic equipment to be employed in a mobile telephone, the countermeasure to vibration and noise is more strictly controlled than a stationary equipment. A general construction of such an electronic equipment is shown in FIGS. 4 and 5.

Referring to FIGS. 4 and 5, the conventional electronic equipment is generally composed of a box 1 having an opening, a printed circuit board 2 to be accommodated in the box 1 and having an integrated circuit (IC) 2a on one surface, electronic parts 2b such as chip resistors and capacitors on the other surface and connector terminals 2c, and a shielding cover 3 for protecting the electronic parts 2b and shieldably closing the opening of the box 1 for the purpose of shielding an oscillator incorporated in the IC. After the cover 3 is soldered to the box 1, the assembly is mounted on a printed circuit board 4 of a mobile telephone set. In mounting the assembly, earth tabs 1a projecting from the opening end of the box 1 are inserted into earthing through-holes 4a formed through the printed circuit board 4, and are fixed by soldering 5 as shown in Fig. 5. Reference numerals 1b formed in the box 1 designate stoppers for receiving the end portion of the printed circuit board 2.

FIGS. 6, 7 and 8 show a conventional shield structure. The box 1 is formed at its opening edge with substantially central four recesses 1c, and the cover 3 is formed at its peripheral edge with four projections 3a to be engaged with the recesses 1c. After the cover 3 is positioned in the opening of the box 1, the cover 3 and the inner peripheral surface of the box 1 are entirely fixed by soldering 6.

However, in the above-mentioned conventional shield structure, there must be provided a step for forming a space where the solder 6 is to be piled up between the opening edge of the box 1 and the upper surface of the cover 3. This step must be made as large as possible since a large amount of solder must be piled so as to prevent a solder crack due to a sudden change in temperature. Therefore, the equipment is hindered from being made compact because of the provision of this step. Furthermore, the solder 6 tends to flow through the recesses 1c of the box 1 to the outer surface of the box 1, causing a stain in appearance and bad soldering. Moreover, since the inner peripheral surface of the box 1 contacts only the peripheral edge of the cover 3, the solder 6 tends to flow into the box 1, causing short circuit of the electronic parts 2b.

SUMMARY OF THE INVENTION

Accordingly, it is a first object of the present invention to provide a shield structure which may make the electronic equipment compact.

It is a second object of the present invention to provide a shield structure which may improve the strength of soldering.

It is a third object of the present invention to provide a shield structure which may prevent the solder from flowing out to the outer surface of the box.

It is a fourth object of the present invention to provide a shield structure which may prevent the solder from flowing into the box and thereby eliminate the occurrence of bad soldering.

It is a fifth object of the present invention to provide a shield structure which may make a soldering work easy.

It is a sixth object of the present invention to provide a shield structure which may improve the strength against an external force.

According to the present invention, there is provided in a shield structure of an electronic equipment including a printed circuit board on which electronic parts are mounted, a box having an upper opening for receiving the printed circuit board, and a shielding planar cover for shieldably covering the upper opening of the box, the cover being soldered at its peripheral edge to a side wall of the box; the improvement characterized in that the peripheral edge of the cover is arcuately downwardly bent.

With this arrangement, there is no need for providing the step for allowing the solder to be piled up between the box and the cover, thereby making the equipment compact. Furthermore, there is no need for forming the recesses at the peripheral edge of the box, thereby preventing the solder from flowing out to the outer surface of the box. Moreover, a contact surface between the inner surface of the box and the cover may be enlarged, thereby preventing the solder from flowing into the box. In addition, as the solder is applied down to a deep portion of the box, the strength of soldering may be improved.

Other objects and features of the invention will be more fully understood from the following detailed description and appended claims when taken with the accompanying drawings.

DETAILED DESCRIPTION OF THE PREFERRED EMBODIMENT

Figure 1:
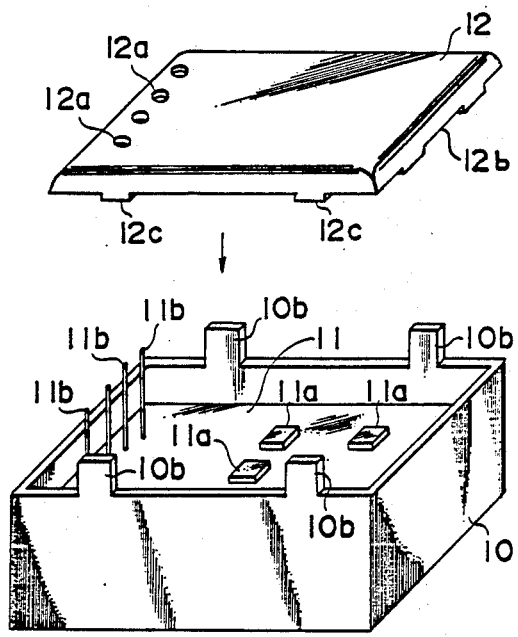
FIG. 1 is a perspective view of the electronic equipment employing the shield structure with the cover being separated according to the present invention.
Figure 2:
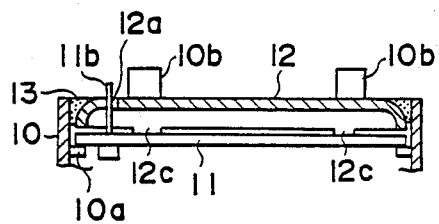
FIG. 2 is a vertical sectional view of the essential part of the electronic equipment with the cover being mounted.
Figure 3:
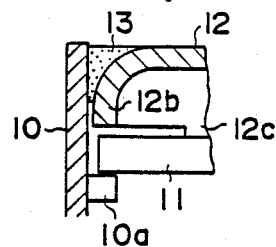
FIG. 3 is an enlarged sectional view of FIG. 2.
Figure 4:
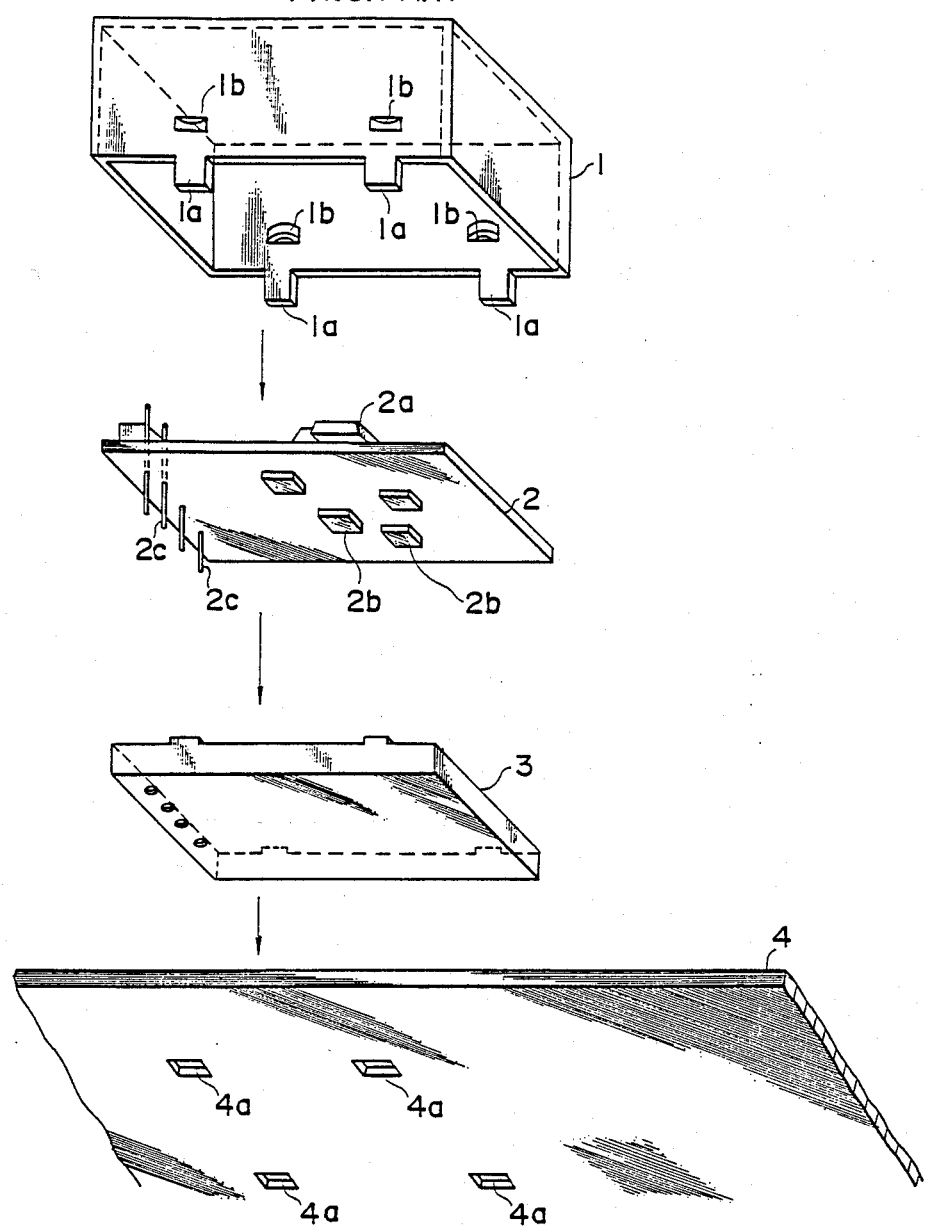
FIG. 4 is a schematic exploded perspective view of the electronic equipment in the prior art.
Figure 5:
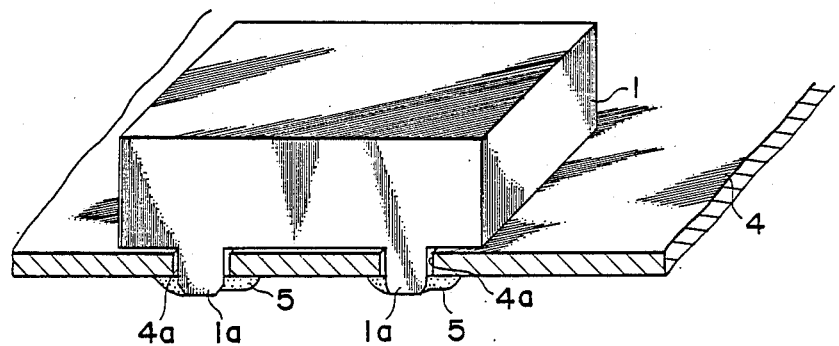
FIG. 5 is a perspective view of the electronic equipment shown in FIG. 4 under the assembled condition.
Figure 6:
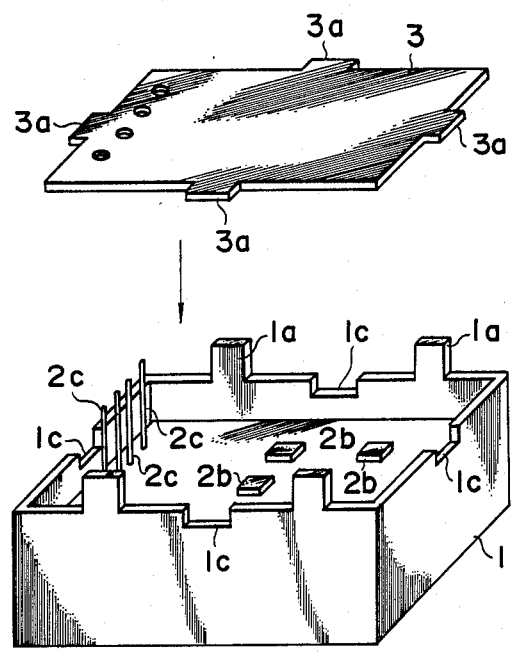
FIG. 6 is an exploded perspective view of the electronic equipment employing the conventional shield structure with the cover being separated.
Figure 7:
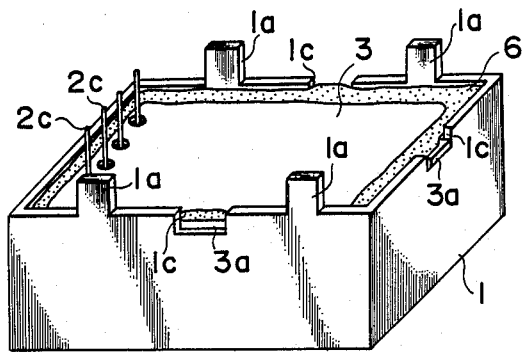
FIG. 7 is a perspective view of the electronic equipment shown in FIG. 6 with the cover being installed.
Figure 8:
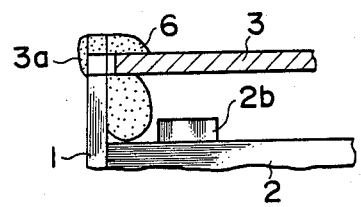
FIG. 8 is an enlarged sectional view of the essential part of the electronic equipment shown in FIG. 7, illustrating that the solder flows out to the outer surface of the box and flows into the box.

Referring to FIGS. 1 to 3 which show a preferred embodiment of the present invention, reference numeral 10 designates a box for accommodating a printed circuit board 11 provided with electronic parts 11a and connector terminals 11b. The printed circuit board 11 is supported by stoppers 10a inwardly projecting from the inside surface of the box 10. The box 10 is further provided with earth tabs 10b outwardly projecting from the opening edge of the box 10.

Reference numeral 12 designates a shielding cover for covering the opening of the box 10. The cover 12 is formed with a plurality of through-holes 12a through which the connector terminals 11b of the printed circuit board 11 are inserted. The cover 12 has four peripheral edges each of which is bent downwardly arcuately. The lower end of each bent portion forms a straight portion 12b, and a plurality of stopper projections 12c are formed at the lower end of each straight portion 12b along the longitudinal direction thereof. That is, the cover 12 is inserted through the opening of the box 10 and is received therein. Then, the cover 12 is positioned on the printed circuit board 11 by means of the stopper projections 12c of the cover 12, and is closely fitted with the box 10 by resiliently contacting the straight portions 12b with the inner wall surface of the box 10.

In such an assembly of the cover 12 and the box 10, the upper surface of the cover 12 is flush with the upper edge of the side wall of the box 10. As the peripheral edge of the cover 12 is downwardly arcuately bent, there is defined a groove between the cover 12 and the side wall of the box 10. The groove is utilized for a soldering space in which a solder 13 is filled.

While the invention has been described with reference to a specific embodiment, the description is illustrative and is not to be construed as limiting the scope of the invention. Various modifications and changes may occur to those skilled in the art without departing from the spirit and scope of the invention as defined by the appended claims.

What is claimed is:

1. In a shield structure of an electronic equipment including a printed circuit board on which electronic parts are mounted, a box having an upper opening for receiving said printed circuit board, and a shielding planar cover for shieldably covering said upper opening of said box, said cover being soldered at its peripheral edge to a side wall of said box; the improvement characterized in that said peripheral edge of said cover is arcuately downwardly bent,
    wherein a lower end of each bent portion forms a straight portion, and a plurality of stopper projections are formed at a lower end of each straight portion along a longitudinal direction thereof.

2. The shield structure as defined in claim 1, wherein said cover is positioned on said printed circuit board by means of said stopper projections of said cover, and is closely fitted with said box by resiliently contacting said straight portion with an inner wall surface of said box.

3. The shield structure as defined in claim 2, wherein an upper surface of said cover is flush with an upper edge of the side wall of said box.

* * * * *